United States Patent
Raj et al.

(10) Patent No.: US 7,697,898 B2
(45) Date of Patent: Apr. 13, 2010

(54) METHOD AND APPARATUS FOR PROCESSING A FREQUENCY MODULATED (FM) SIGNAL USING AN ADAPTIVE EQUALIZER

(75) Inventors: Raghu G. Raj, Austin, TX (US); Jon D. Hendrix, Wimberley, TX (US); Junsong Li, Austin, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 1348 days.

(21) Appl. No.: 10/779,217

(22) Filed: Feb. 13, 2004

(65) Prior Publication Data

US 2005/0181741 A1 Aug. 18, 2005

(51) Int. Cl.
*H04B 17/00* (2006.01)
(52) U.S. Cl. .................. 455/67.13; 455/67.11; 455/68; 455/226.1; 455/226.2; 455/307; 455/340; 375/229; 375/230; 375/232; 375/233
(58) Field of Classification Search ... 455/67.11–67.16, 455/226.1–226.4, 277.1–277.2, 307, 339–340, 455/68–69; 375/322, 315, 229–234, 347
See application file for complete search history.

(56) References Cited

U.S. PATENT DOCUMENTS

| | | | | |
|---|---|---|---|---|
| 4,752,969 A | * | 6/1988 | Rilling | 455/278.1 |
| 5,544,201 A | * | 8/1996 | Hoshino et al. | 375/350 |
| 5,548,542 A | * | 8/1996 | Rauth et al. | 708/319 |
| 5,710,995 A | * | 1/1998 | Akaiwa et al. | 455/277.2 |
| 6,563,868 B1 | * | 5/2003 | Zhang et al. | 375/232 |
| 6,564,044 B1 | * | 5/2003 | Rilling | 455/277.1 |
| 2003/0035498 A1 | * | 2/2003 | Li et al. | 375/322 |
| 2003/0157914 A1 | | 8/2003 | Li et al. | |

FOREIGN PATENT DOCUMENTS

EP 0 685 937 B1 4/2001

OTHER PUBLICATIONS

Adduci, F. et al.; "A DSP-Based Digital IF AM/FM Car-Radio Receiver"; Date unknown but reference known to inventors.
Nussbaum, D. et al.; "Recursive Blind Equalizer based on Godard's Criterion for FM broadcasting"; IEEE DSP 97; 1997; pp. 969-972; IEEE.
Tong, F. et al; "A switching CMA/Diversity Antenna for Canceling Echoes with Fading in an FM Broadcasting Receiver"; IEEE; 1996; pp. 272-276; IEEE.
Rao, A et al.; "PCMA: Parametric Constant Modulus Algorithm for Demodulating Co-Channel FM Signals"; Proceedings of ASILOMAR-29; 1996; pp. 473-477; IEEE.

* cited by examiner

*Primary Examiner*—Tuan A Tran

(57) ABSTRACT

Embodiments of the present invention relate generally to receivers. A frequency modulated (FM) receiver includes an equalizer control unit coupled to receive at least one FM signal quality indicator and provide a control signal based on the FM signal quality indicator. An adaptive equalizer coupled to receive the control signal from the equalizer control unit and an FM signal and provide a filtered FM signal corresponding to the received FM signal. Coefficients of the adaptive equalizer are reset in response to the control signal. Another embodiment relates to a method for processing a frequency modulated (FM) signal. An FM signal is received. At least one FM signal quality indicator is used to provide a control signal. Based on the control signal, the received FM signal is filtered using one of an adaptive filter and a static filter to provide a filtered FM signal.

25 Claims, 3 Drawing Sheets

METHOD AND APPARATUS FOR PROCESSING A FREQUENCY MODULATED (FM) SIGNAL USING AN ADAPTIVE EQUALIZER

FIELD OF THE INVENTION

The present invention relates generally to digital receivers and more specifically to digitized FM radio.

RELATED ART

The mobile FM car radio channel is highly time varying due to short range Rayleigh fading multipath effects. In digital intermediate frequency (DIF) FM radio systems, certain amplitude compensation algorithms may be used to compensate for the effects of the frequency selective fading multipath channel. DIF FM radio systems generally utilize algorithms of this sort to equalize multipath channels by exploiting the fact that multipath fading may cause a deviation in the constant envelope property of FM signals. For example, the Constant Modulus Algorithm (CMA) is a well known blind equalization algorithm which exploits the constant modulus property of certain types of transmitted signals, as is the case for FM broadcast.

Although using amplitude compensation algorithms may minimize the effects multipath fading, certain problems may arise as a result of their use. For example certain amplitude compensation algorithms remain fixed at a non-optimum point under static, typical signal conditions. Having the amplitude compensation algorithm "get stuck" at a non-optimum point can result in an increased amount of total harmonic distortion at the output of the DIF FM radio system. In addition, the amplitude compensation algorithms may potentially harm the tuned station's signal by providing adjustments to the filter coefficients used by the adaptive filter of the DIF FM radio system when adjustments are not necessary. As a result, the likelihood of the amplitude compensation algorithm producing incorrect adjustments to the adaptive filter increases and the aftereffects of the incorrect adjustments result in inappropriate compensation of the tuned FM signal. The inappropriate compensation may cause an undesired distorted audio signal to be output by the DIF radio.

Therefore, the need exists for an improved receiver design that combats signal degradation.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

One embodiment relates to a method for processing a frequency modulated (FM) signal. An FM signal is received. At least one FM signal quality indicator is used to provide a control signal. Based on the control signal, the received FM signal is filtered using one of an adaptive filter and a static filter to provide a filtered FM signal.

Another embodiment relates to a method for processing a frequency modulated (FM) signal. An FM signal is received. The FM signal is filtered using an adaptive filter having coefficients updated using a constant modulus algorithm (CMA). The adaptive filter is selectively reset based on at least one FM signal quality indicator.

Another embodiment relates to a method for processing a frequency modulated (FM) signal. An FM signal is received. The FM signal is filtered using an adaptive filter having coefficients updated using a constant modulus algorithm (CMA). The adaptive filter is reset based on a system clock.

Another embodiment relates to a frequency modulated (FM) receiver. The receiver includes an equalizer control unit coupled to receive at least one FM signal quality indicator and provide a control signal based on the at least one FM signal quality indicator. An adaptive equalizer is coupled to receive the control signal from the equalizer control unit and an FM signal. The adaptive equalizer provides a filtered FM signal corresponding to the received FM signal. In addition, coefficients of the adaptive equalizer are reset in response to the control signal.

Figure 1:
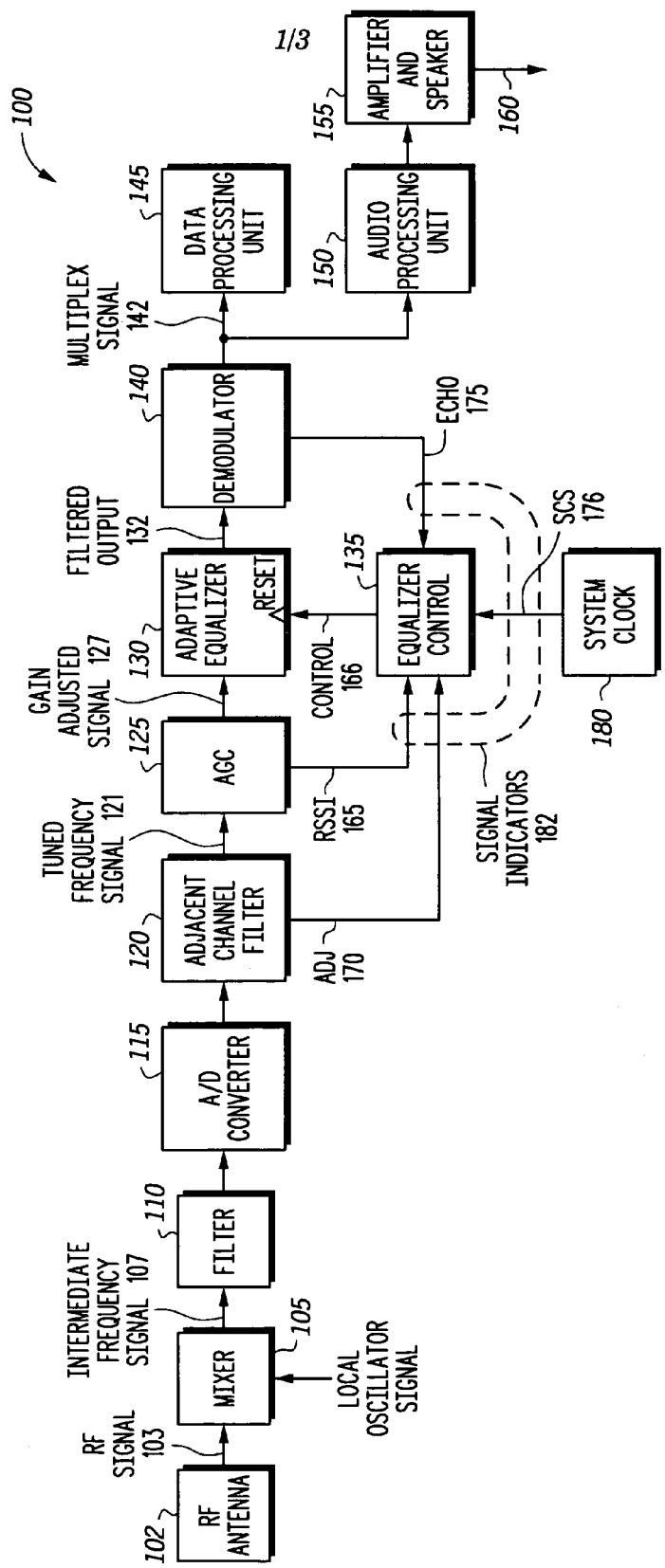
FIG. 1 illustrates, in block diagram form, a radio receiver in accordance with one embodiment of the present invention.

FIG. 1 illustrates a digital FM receiver in accordance with one embodiment of the present invention. Radio receiver 100 includes an RF antenna 102, a mixer 105, a bandpass filter 110, an analog-to-digital (A/D) converter 115, an adjacent channel filter 120, an automatic gain control (AGC) 125, an adaptive equalizer 130, an equalizer control unit 135 (equalizer control 135), a system clock 180, a demodulator 140, a data processing unit 145, an audio processing unit 150, and amplifier and speaker 155. An output of RF antenna 102 is coupled to an input of mixer 105. An output of mixer 105 is coupled to an input of bandpass filter 110. An output of bandpass filter 110 is coupled to an input of A/D converter 115. An output of A/D converter 115 is coupled to an input of adjacent channel filter 120. An output of adjacent channel filter 120 is coupled to an input of automatic gain control (AGC) 125. An output of adjacent channel filter 120 is coupled to an input of equalizer control 135. An output of automatic gain control 125 is coupled to an input of adaptive equalizer 130. An output of automatic gain control 125 is coupled to an input of equalizer control 135. An output of adaptive equalizer 130 is coupled to an input of demodulator 140. An input of adaptive equalizer 130 is coupled to an output of equalizer control 135. An output of demodulator 140 is coupled to an input of audio processing unit 150 and an input of data processing unit 145. An output of demodulator 140 is coupled to an input of equalizer control 135. An output of system clock 180 is coupled to an input of equalizer control 135. An output of audio processing unit 150 is coupled to an input of amplifier and speaker 155 which provides output signals via conductor 160. Although not shown, data processing unit 145 may be bi-directionally coupled to a user interface.

In operation, RF antenna 102 captures radio frequency signals and provides them to mixer 105. Mixer 105 receives the radio frequency signals (RF input signal 103) from antenna 102 and multiplies the RF input signal with a local oscillator (LO) signal. The resulting product is an intermediate frequency signal 107 containing both a sum and a difference component. Bandpass filter 110 removes the sum component and couples the difference component to A/D converter 115. The A/D converter 115 performs a conversion of the filtered signal to a digital format.

Adjacent channel filter 120 receives and digitally filters the output of A/D converter 115 to remove the adjacent frequency channel energy, leaving a substantially clearer digital filtered tuned intermediate frequency (IF) signal (tuned frequency signal 121) which is provided to AGC 125. In one embodiment, tuned frequency signal 121 may be an FM signal being listened to by an end-user. Adjacent channel filter 120 measures the signal strength of the adjacent frequency channel energy and generates a corresponding adjacent frequency channel energy indicator ADJ 170. ADJ 170 is provided to equalizer control 135 (along with other signal indicators 182 it necessary) to generate control signal 166 (control 166). The details of how equalizer control 135 uses signal indicators 182 to generate control signal 166 will be discussed further below in the descriptions of FIG. 2 and FIG. 3.

AGC 125 receives filtered tuned frequency signal 121 and determines whether the amplitude of the envelope of tuned frequency signal 121 is within a predetermined range specified by adaptive equalizer 130. If the amplitude of the envelope of tuned frequency signal 121 is not within the predetermined range, tuned frequency signal 121 is amplified or attenuated by AGC 125 in order to place the amplitude within the predetermined range. If the amplitude of the envelope of tuned frequency signal 121 is within the predetermined range, tuned frequency signal 121 remains neither amplified nor attenuated by AGC 125 for purposes of placing the amplitude within the predetermined range (since the amplitude of the envelope of tuned frequency signal 121 is within the predetermined range). In one embodiment, the minimum and maximum values of the predetermined range, may be, for example, 100 dBuV and 109 dBuV. In alternate embodiments, the minimum and maximum values of the predetermined range may vary based upon the adaptive equalizer being used by receiver 100. The resulting gain adjusted signal 127 is provided to adaptive equalizer 130 (also referred to as adaptive filter 130).

In addition to providing gain adjusted signal 127 to adaptive equalizer 130, AGC 125 also provides a received signal strength indicator (RSSI) 165 to equalizer control 135 which indicates the signal strength of tuned frequency signal 121. RSSI 165 may then be used by equalizer control 135 (in addition to other signal indicators 182 if necessary) to generate control 166.

Adaptive equalizer 130 receives gain adjusted signal 127 output by AGC 125 and control 166 and compensates, if necessary, for degradations in gain adjusted signal 127 caused by frequency selective multipath fading. The multipath fading may be due to, for example, multiple reflected signals broadcasted from a single source at the same tuned frequency which are not phase-aligned and destructively interfere at the RF antenna 102. The resulting filtered output 132 is provided to demodulator 140.

Demodulator 140 demodulates filtered output 132 to produce an FM multiplex signal 142 and an FM signal quality indicator, echo 175. Echo 175 indicates the amount of high-frequency variation in the envelope (multipath echo) of filtered output 132 provided from adaptive equalizer 130. Echo 175 is provided to equalizer control 135 (in addition to other signal indicators 182 if necessary) to generate control 166.

The FM multiplex signal 142 output by demodulator 140 is provided to data processing unit 145 and/or audio processing unit 150. In one embodiment, FM multiplex signal 142 is decoded by audio processing unit 150 to produce a stereo audio signal. The stereo audio signal is provided to amplifier and speaker 155 to produce an audio output via conductor 160. For example, the stereo audio signal may be music played from radio speakers. In another embodiment, the output of data processing unit 145 may be coupled to a user interface to allow user interaction. For example, receiver 100 may include a user interface (not shown) which may include, for example, a radio dial, a touch screen, monitor and keyboard, keypad, or any other suitable input/output device. The data information may represent text, graphics, or any other information transmitted in digital form. For example, FM multiplex signal 142 may be decoded by data processing unit 145 and provided to a user-display panel for radio station identification.

Figure 2:
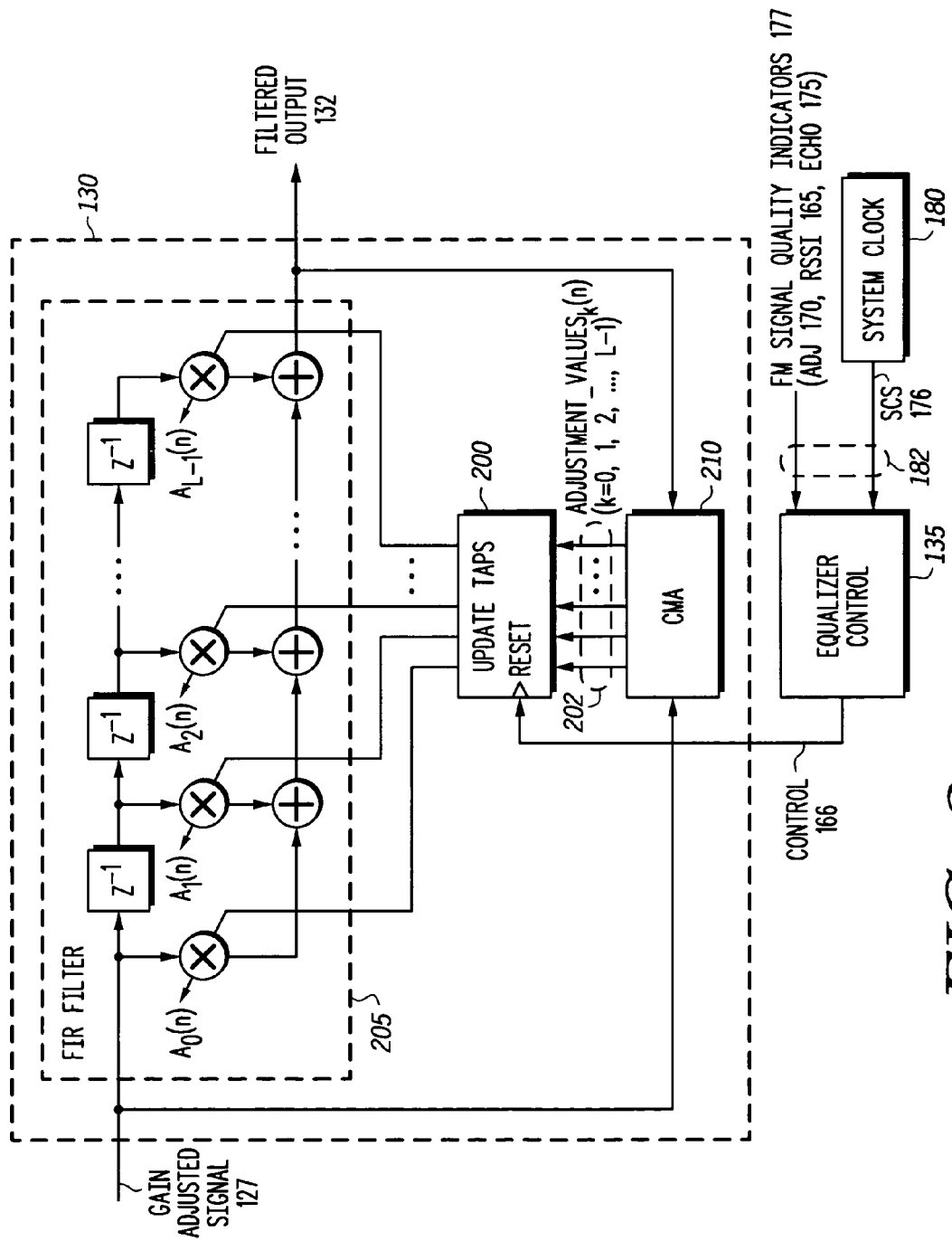
FIG. 2 illustrates, in block diagram form, adaptive equalizer, equalizer control, and system clock of FIG. 1, according to one embodiment of the present invention.

FIG. 2 depicts a portion of radio receiver 100 including adaptive equalizer 130, equalizer control 135, and system clock 180. Adaptive equalizer 130 includes a digital filter 205, update taps 200, and CMA 210. In one embodiment, digital filter 205 may be a finite impulse response (FIR) filter as illustrated in FIG. 2. In alternate embodiments, digital filter 205 may be any other type of digital filter, such as, for example, an infinite impulse response filter (IIR).

In one embodiment digital filter 205 uses filter coefficients $(A_0, A_1, \ldots, A_{L-1})$, to filter gain adjusted signal 127. The filter coefficients are provided from update taps 200 and in one embodiment, are updated according to the following equations:

$$A_k(n)=[A_0, A_1, \ldots, A_{L-1}] \text{ for } (n=0) \qquad \text{Eq. 1:}$$

$$A_k(n)=A_k(n-1)-\text{adjustment\_values}_k(n) \text{ for } (n>0), \qquad \text{Eq. 2:}$$

$$\text{adjustment\_values}_k(n)=\mu \times (|\text{output}(n)|^2-1) \times \text{output}(n) \times \text{input}^*(n-k). \qquad \text{Eq. 3:}$$

In the above algorithm, output represents filtered output 132, input represents the gain adjusted signal 127, $\mu$ is the step size, n is an index representing discrete time, L is an integer greater than 0 representing the number of taps, and k is an index representing each tap such that k=0, 1, 2, ... L−1. In the illustrated embodiment, note that n is incremented for each time sample of gain adjusted signal 127. Alternatively, though, n may be incremented every j time samples of gain adjusted signal 127. Note also that in alternate embodiments, receiver 100 may use other algorithms to perform FM signal compensation operations.

Adjustment values 202 (adjustment_values$_k$(n)) utilized by update taps 200 are generated by CMA 210 and attempt to preserve the constant modulus property inherent in an ideal FM signal. In order to assist in conserving the constant modulus property of gain adjusted signal 127, CMA 210 uses both the input of FIR filter 205 (gain adjusted signal 127) and the output of FIR filter 205 (filtered output 132). Update taps 200 receives adjustment values 202 and selectively determines whether to provide the updated filter coefficients $A_k(n)$ as in Eq. 2 or the fixed set of filter coefficients $A_k(n)$ as in Eq. 1, based on whether or not control 166 is asserted. That is, in one embodiment, the fixed set of filter coefficients (predetermined filter taps) are provided to digital filter 205 when control 166 is asserted, and the updated filter coefficients (updated filter taps) are provided to digital filter 205 when control 166 is de-asserted.

Note that adaptive equalizer 130 may operate as both a static filter and an adaptive filter. For example, adaptive equalizer 130 may operate as an adaptive filter when the filter coefficients utilized by adaptive equalizer 130 are the updated filter coefficients. In addition, adaptive equalizer 130 may operate as a static filter when the filter coefficients utilized by adaptive equalizer 130 are the fixed set of filter coefficients (predetermined values), also known as the static predetermined set of coefficients. For each new sample of gain adjusted signal 127, digital filter 205 receives the updated filter coefficients or the fixed set of filter coefficients from update taps 200 and uses them to generate filtered output 132.

In order to generate control 166, equalizer control 135 uses at least one of signal indicators 182 (including, for example, ADJ 170 from adjacent channel filter 120, RSSI 165 from AGC 125, echo 175 from demodulator 140, and SCS 176 from system clock 180). SCS 176 (provided from system clock 180) is a signal indicator that provides an indication of the amount of time that has elapsed since the filter coefficients of digital filter 205 have been reset. FM signal quality indicators 177 indicate certain attributes of the RF signal at the RF antenna input and provide a description of the RF broadcast conditions. For example, FM signal quality indicators 177 may indicate whether the communications channel has caused a significant degradation in the strength of the transmitted FM signal, whether the communications channel has caused significant multipath channel effects, and whether adjacent frequency channels in the communications channel have caused adjacent channel interference.

When receiver 100 is under certain RF broadcast conditions (as indicated by FM quality signal indicators 177), CMA 210 is likely to behave in such a way that CMA 210 provides non-optimum adjustments to the filter coefficients of digital filter 205. These non-optimum adjustments can cause digital filter 205 to improperly compensate gain adjusted signal 127, resulting in a filtered output signal 132 that deviates further from having a constant modulus.

Based on the values of signal quality indicators 177, equalizer control 135 determines if CMA 210 is likely to produce non-optimum adjustments to gain adjusted signal 127. If CMA 210 is likely to produce optimum adjustments, equalizer control 135 assumes that digital filter 205 is properly compensating gain adjusted signal 127. If this is the case, control signal 166 is de-asserted and CMA 210 continues to provide adjustment values 202 to adaptive equalizer 130 based on, for example, Eqs. 2 and 3. If, based on the signal quality indicators 177, CMA 210 is likely to produce non-optimum adjustments, control signal 166 is asserted and update taps 200 resets the discrete-time variable n to 0 (n=0), thus resetting the filter coefficients to the fixed set of filter coefficients as described in Eq. 1 for n=0. The result is that the filter coefficients of digital filter 205 return to their fixed, known state of initial values. At this point, digital filter 205 is operating as a static filter. In one embodiment the fixed set of filter coefficients may be selected such that the compensation performed on gain adjusted signal 127 is negligible (approximately zero). For example, by selecting the fixed set of filter coefficients such that $A_0=1$ and $A_i=0$ for $i>0$, adaptive equalizer 130 may be considered to operate as an all-pass filter preventing gain adjusted signal 127 from being inappropriately compensated. Alternatively, any other values of $A_k(n)$ may be used upon reset (n=0) to implement, for example, any type of static filter. (Note that in the embodiment of Eq. 1, the fixed set of filter coefficients used upon reset is applied for only 1 discrete time sample (for n=0). However, in alternate embodiments, the fixed set of filter coefficients used upon reset in Eq. 1 may be used for more than 1 discrete time sample, i.e., n may be within a range of values. For example, $0 \geq n \geq 10$ for Eq. 1 and correspondingly n>10 for Eq. 2.) Therefore, based on whether control 166 is de-asserted or asserted, either the updated filter coefficients or the fixed set of filter coefficients is provided to digital filter 205 to generate filtered output 132.

In an alternate embodiment, adaptive equalizer 130 may be selectively bypassed based on control 166. For example, in this embodiment, when control 166 is asserted, adaptive equalizer 130 may be bypassed for a predetermined amount of time prior to resetting digital filter 205. In this embodiment, gain adjusted signal 127 is not filtered by digital filter 205 for the predetermined amount of time.

Figure 3:
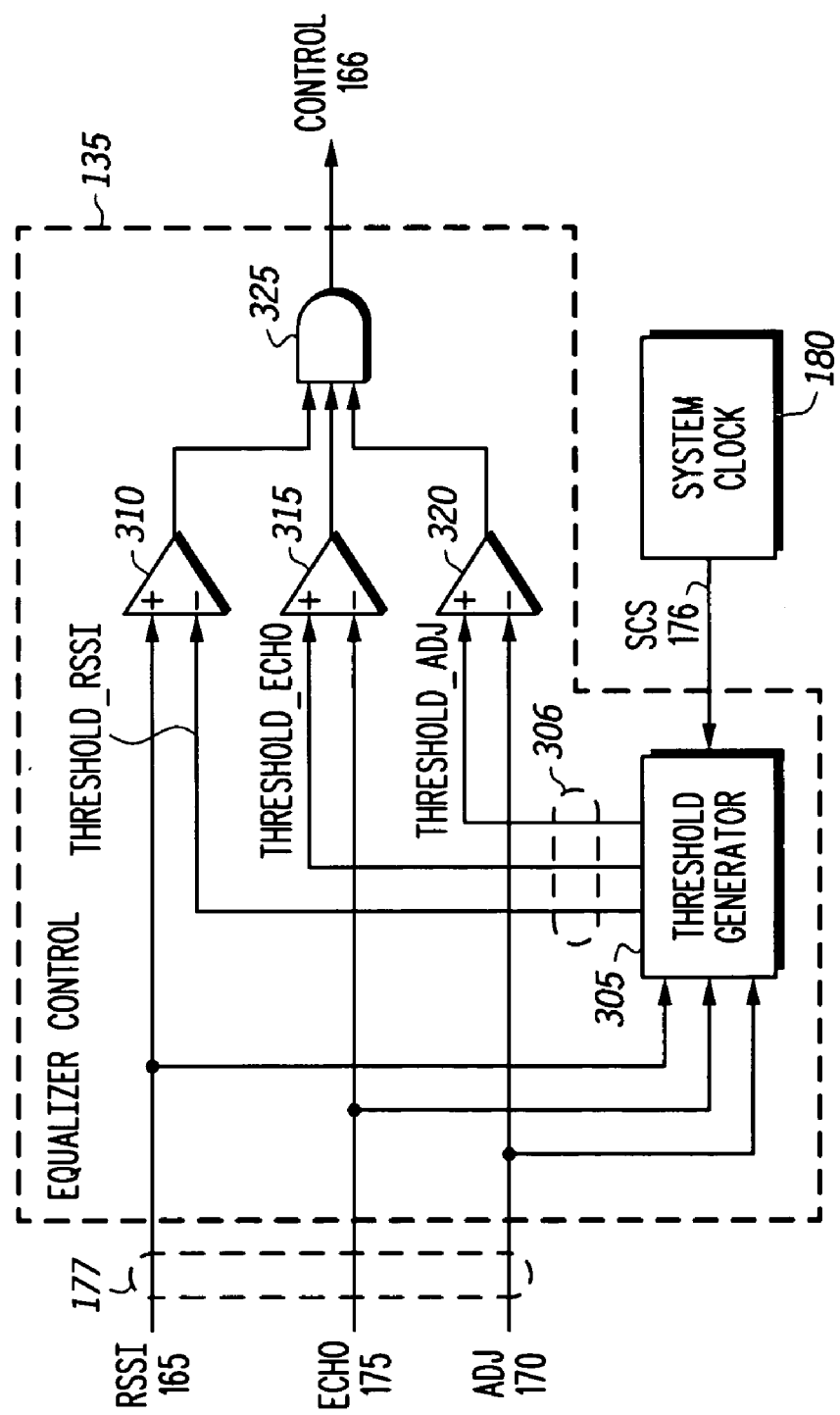
FIG. 3 illustrates, in block diagram form, equalizer control and system clock of FIG. 1 according to one embodiment of the present invention.

FIG. 3 includes equalizer control 135 and system clock 180 and depicts equalizer control 135 in more detail in accordance with one embodiment of the present invention. Equalizer control 135 includes comparator 310, comparator 315, comparator 320, AND gate 325, and threshold generator 305. Equalizer control 135 receives FM signal quality indicators RSSI 165, echo 175, and ADJ 170 and compares them to their respective thresholds generated by threshold generator 305. Comparing FM signal quality indicators 177 to thresholds 306 (generated by threshold generator 305) allows equalizer control 135 to determine the RF broadcast conditions under which receiver 100 is operating.

Referring to FIG. 3, equalizer control 135 receives RSSI 165 and determines the signal strength of tuned frequency signal 121 using comparator 310. In one embodiment, comparator 310 compares RSSI 165 to threshold_RSSI. If RSSI 165 is greater than threshold_RSSI, then the output of comparator 310 is asserted and the RF signal is considered to be a strong signal. If RSSI 165 is less than or equal to threshold_RSSI, then the output of comparator 310 is de-asserted, and the RF signal is considered to be a weak signal.

Equalizer control 135 receives echo 175 from demodulator 140 and determines the level of multipath echo contained in filtered output 132 using comparator 315. In one embodiment, comparator 315 compares echo 175 to threshold_echo. If echo 175 is less than or equal to threshold_echo, then the output of comparator 315 is asserted indicating a fairly low amount of multipath echo in filtered output 132. If echo 175 is greater than threshold_echo, then the output of comparator 315 is de-asserted and filtered output 132 is considered to have a fairly strong amount of multipath echo.

Equalizer control 135 receives ADJ 170 and uses comparator 320 to determine whether the RF signal in an adjacent frequency channel is interfering with tuned frequency signal 121. In one embodiment, comparator 320 compares ADJ 170 to threshold_ADJ. If ADJ 170 is less than or equal to threshold_ADJ, then the output of comparator 320 is asserted and the level of adjacent frequency channel energy (and the corresponding adjacent frequency channel interference) is considered to be relatively low. If ADJ 170 is greater than threshold_ADJ, then the output of comparator 320 is de-asserted and the strength of the adjacent frequency channel energy is considered to be high.

The outputs of comparator 310, comparator 315, and comparator 320 are provided to AND gate 325 and logically ANDed to produce control 166. In one embodiment, when the output of comparators 310, 315, and 320 are asserted, control 166 is asserted and the discrete-time variable n is reset and adaptive equalizer 130 filters the signal according to the fixed set of filter coefficients. In one embodiment, the action of resetting n to n=0 serves to return the filter coefficients to the fixed set of filter coefficient values that are known to "do no harm" to gain adjusted signal 127. When at least one of the outputs of comparators 310, 315, and 320 is de-asserted, control 166 is de-asserted and adaptive equalizer 130 filters gain adjusted signal 127 according to the updated filter coefficients.

In one embodiment, in order to generate thresholds 306 (threshold_RSSI, threshold_echo, and threshold_ADJ), threshold generator 305 performs a series of decisions based on the values of RSSI 165, echo 175, ADJ 170, and/or SCS 176. For example, threshold_RSSI may be set based not only on the value of RSSI 165, but also on the values of echo 175 and ADJ 170. In this case, if the value of RSSI 165 indicates that tuned frequency signal 121 is strong and the values of echo 175 and ADJ 170 indicate that almost no interference from either multipath echo or the adjacent frequency channel is present, then the value of threshold_RSSI may be selected to be small. Since, for example, CMA 210 is likely to produce inappropriate adjustment values under a strong signal condition (signal conditions with little or no interference), selecting threshold_RSSI to be small allows comparator 310 to assert its output for a greater range of RSSI values. In another example, if the value of RSSI 165 indicates that the signal is strong and the value of echo 175 indicates that there is significant interference caused by multipath echo, then the value of threshold_RSSI may be selected to be relatively large such that comparator 310 will assert its output for a smaller range of RSSI values. Since CMA 210 is likely to provide some benefit to gain adjusted signal 127 under these signal conditions, selecting threshold_RSSI to be large allows comparator 310 to de-assert its output in order for control 166 to be de-asserted.

In another embodiment, in order to generate thresholds 306, threshold generator 305 may use SCS 176 to create a time out condition where the number of clock cycles are counted since control 166 was previously asserted. The timeout condition may be created such that if control 166 has not been asserted by the time the counter reaches a predetermined limit value, threshold generator 305 selects threshold values for threshold_RSSI, threshold_ADJ, and threshold_ECHO that cause the outputs of comparators 310, 315, and 320 to be asserted regardless of the values of FM signal quality indicators 177.

Note that the various hardware units and circuitry described throughout the application can be reused or shared by various functions Note that the comparator circuitry performing the comparator operations (such as comparator 310, comparator 315, and comparator 320) may be any comparator circuitry that performs the comparator operations described herein. Embodiments of the present invention can be implemented in hardware, software, or in a combination of both. For example, some embodiments may be implemented by a finite state machine having control circuitry with microcode to control execution of the state machine. Alternatively, software code may be used to perform the above functions.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for processing a frequency modulated (FM) signal comprising:
   receiving an FM signal;
   using at least one FM signal quality indicator to provide a control signal;
   when the control signal has a first value, filtering the received FM signal using an adaptive filter; and
   when the control signal has a second value, different from the first value, filtering the received FM signal using a static filter.

2. The method of claim 1, wherein coefficients of the adaptive filter are updated using a constant modulus algorithm (CMA).

3. The method of claim 1, wherein coefficients of the static filter correspond to a static predetermined set of coefficients.

4. The method of claim 1, wherein the static filter operates as an all-pass filter.

5. The method of claim 1, wherein the at least one FM signal quality indicator comprises at least one of a received signal strength indicator, an adjacent channel energy indicator, and a multipath echo indicator.

6. The method of claim 5, wherein using the at least one FM signal quality indicator to provide the control signal comprises:
   comparing at least one of the received signal strength indicator, the adjacent channel energy indicator, and the multipath echo indicator to a corresponding threshold; and
   providing the control signal in response to comparing.

7. The method of claim 6, wherein the corresponding threshold is a function of at least one of the received signal strength indicator, the adjacent channel energy indicator, and the multipath echo indicator.

8. The method of claim 6, wherein the corresponding threshold is a function of at least two of the received signal strength indicator, the adjacent channel energy indicator, and the multipath echo indicator.

9. The method of claim 5, wherein using the at least one FM signal quality indicator to provide the control signal comprises:
   comparing each of the received signal strength indicator, the adjacent channel energy indicator, and the multipath echo indicator to a corresponding threshold; and
   providing the control signal in response to comparing.

10. The method of claim 1, wherein the FM signal is received via a radio frequency (RE) antenna.

11. A method for processing a frequency modulated (FM) signal comprising:
  receiving an FM signal;
  filtering the FM signal using an adaptive filter having coefficients updated using a constant modulus algorithm (CMA); and
  selectively resetting the adaptive filter based on at least one FM signal quality indicator, wherein the selectively resetting comprises:
    comparing the at least one FM signal quality indicator with one or more corresponding thresholds to produce a comparison result;
    when the comparison result has a first value, updating the coefficients of the adaptive filter using the CMA; and
    when the comparison result has a second value, different from the first value, resetting the adaptive filter by setting the coefficients of the adaptive filter to predetermined values.

12. The method of claim 11, wherein the predetermined values allow the adaptive filter to operate as an all-pass filter.

13. The method of claim 11, wherein the at least one FM signal quality indicator comprises at least one of a received signal strength indicator, an adjacent channel energy indicator, and a multipath echo indicator.

14. The method of claim 13, wherein selectively resetting the adaptive filter based on the at least one FM signal quality indicator comprises:
  comparing at least one of the received signal strength indicator, the adjacent channel energy indicator, and the multipath echo indicator to a corresponding threshold; and
  selectively resetting the adaptive filter in response to comparing.

15. The method of claim 14, wherein the corresponding threshold is a function of at least one of the received signal strength indicator, the adjacent channel energy indicator, and the multipath echo indicator.

16. The method of claim 14, wherein the corresponding threshold is a function of at least two of the received signal strength indicator, the adjacent channel energy indicator, and the multipath echo indicator.

17. The method of claim 13, wherein selectively resetting the adaptive filter based on the at least one FM signal quality indicator comprises:
  comparing each of the received signal strength indicator, the adjacent channel energy indicator, and the multipath echo indicator to a corresponding threshold; and
  selectively resetting the adaptive filter in response to comparing.

18. The method of claim 11, wherein selectively resetting the adaptive filter based on the at least one FM signal quality indicator comprises:
  based on the at least one FM signal quality indicator, bypassing the adaptive filter for a predetermined amount of time;
  resetting the adaptive filter after the predetermined amount of time; and
  applying the reset adaptive filter to the received FM signal.

19. The method of claim 11, wherein the FM signal is received via a radio frequency (RF) antenna.

20. A method for processing a frequency modulated (FM) signal comprising:
  receiving an FM signal;
  filtering the FM signal using an adaptive filter having coefficients updated using a constant modulus algorithm (CMA); and
  periodically resetting the adaptive filter to predetermined values based on a system clock.

21. A frequency modulated (FM) receiver, comprising:
  an equalizer control unit coupled to receive at least one FM signal quality indicator and provide a control signal based on the at least one FM signal quality indicator; and
  an adaptive equalizer coupled to receive the control signal from the equalizer control unit and an FM signal, wherein the adaptive equalizer provides a filtered FM signal corresponding to the received FM signal when the control signal has a first value and wherein coefficients of the adaptive equalizer are reset when the control signal has a second value, different from the first value.

22. The FM receiver of claim 21, wherein the at least one FM signal quality indicator comprises at least one of a received signal strength indicator, an adjacent channel energy indicator, and a multipath echo indicator.

23. The FM receiver of claim 21, wherein the adaptive equalizer comprises:
  a filter;
  a constant modulus algorithm (CMA) unit; and
  a taps updater coupled to receive the control signal and information from the CMA unit and coupled to provide updated filter taps to the filter based on the information from the CMA unit when the control signal has a first value and predetermined filter taps to the filter when the control signal has a second value.

24. The FM receiver of claim 21, wherein the equalizer control unit comprises:
  a threshold generator to provide a corresponding threshold for each of the at least one FM signal quality indicators; and
  a comparison unit coupled to provide the control signal based on the at least one FM signal quality indicator and the corresponding threshold for each of the at least one FM signal quality indicators.

25. The FM receiver of claim 24, wherein the at least one FM signal quality indicator comprises at least one of a received signal strength indicator, an adjacent channel energy indicator, and a multipath echo indicator, and wherein the corresponding threshold for each of the at least one FM signal quality indicators is based on at least one of the received signal strength indicator, the adjacent channel energy indicator, and the multipath echo indicator.

* * * * *